United States Patent [19]

McMasters

[11] Patent Number: 4,609,402

[45] Date of Patent: Sep. 2, 1986

[54] METHOD OF FORMING MAGNETOSTRICTIVE RODS FROM RARE EARTH-IRON ALLOYS

[75] Inventor: O. Dale McMasters, Ames, Iowa

[73] Assignee: Iowa State University Research Foundation, Inc., Ames, Iowa

[21] Appl. No.: 792,341

[22] Filed: Oct. 28, 1985

[51] Int. Cl.$^4$ ............................................. C22B 59/00
[52] U.S. Cl. ...................................... 75/65 ZM; 75/84
[58] Field of Search ............................. 75/65 ZM, 84

[56] References Cited

U.S. PATENT DOCUMENTS 3,086,856  4/1963  Siebertz ........................... 75/65 ZM
3,891,431  6/1975  Sahm ................................ 75/65 ZM Primary Examiner—Peter D. Rosenberg
Attorney, Agent, or Firm—Tilton, Fallon, Lungmus & Chestnut

[57] ABSTRACT

Rods of magnetrostructive alloys of iron with rare earth elements are formed by flowing a body of rare earth-iron alloy in a crucible enclosed in a chamber maintained under an inert gas atmosphere, forcing such molten rare-earth-iron alloy into a hollow mold tube of refractory material positioned with its lower end portion within the molten body by means of a pressure differential between the chamber and mold tube and maintaining a portion of the molten alloy in the crucible extending to a level above the lower end of the mold tube so that solid particles of higher melting impurities present in the alloy collect at the surface of the molten body and remain within the crucible as the rod is formed in the mold tube.

10 Claims, 5 Drawing Figures

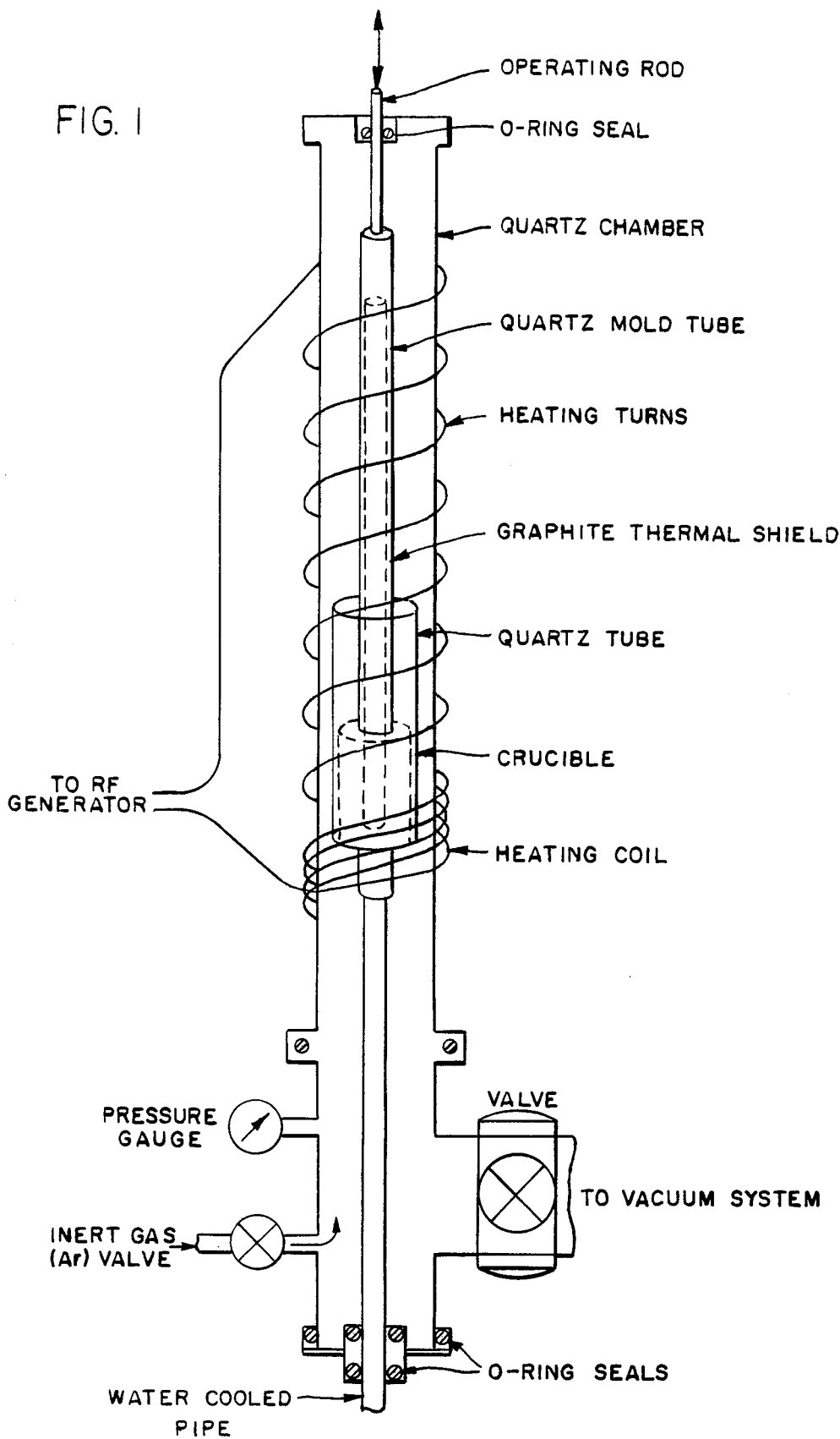

METHOD OF FORMING MAGNETOSTRICTIVE RODS FROM RARE EARTH-IRON ALLOYS

This invention was conceived and reduced to practice under a contract with the Department of Energy, Contract W-7405-ENG-82.

FIELD OF INVENTION, BACKGROUND & PRIOR ART

The field of this invention is the manufacturing of magnetostrictive metal rods. The invention is particularly concerned with the conversion of rare-earth iron alloys into grain-oriented magnetostrictive rods.

In recent years considerable research has been devoted to the development of magnetostrictive compounds, and in particular rare earth-iron alloys. These developments are summarized by A. E. Clark, Chapter 7, pages 531–589, in "Ferromagnetic Materials," Vol. 1, (Ed. E. P. Wohlforth, North-Holland, Publ. Co., 1980). A major objective of the research has been to develop rare earth-iron alloys with large room temperature magnetostriction constants. Technically important alloys having these properties include alloys of terbium together with dysposium and/or holmium. The relative proportions of the rare earths and the iron are varied to maximize room temperature magnetostriction and minimize magnetic anisotropy. Presently, the most technically advanced alloy of this kind is represented by the formula $Tb_xDy_{1-x}Fe_{1.5-2.0}$ wherein x is a number from 0.27 to 0.35. An optimized ratio is $Tb_{0.3}Dy_{0.7}Fe_{1.9}$ which is known as terfenol-D, as described in U.S. Pat. No. 4,308,474.

Such rare earth-iron alloys are true compounds and can exist in crystalline or polycrystalline form. In preparing elongated bodies (viz. rods) from such alloys, grain-orientation of the crystals is essential for achieving high magnetostriction. An axial grain orientation of the crystallites not only increases the magnetostriction constant but also reduces internal losses at the grain boundaries. This is particularly important in applications where a high magnetostriction at low applied fields is required. (See Clark, cited above, pages 545–547.)

Heretofore the methods employed for preparing grain-oriented rods have not been adapted for large scale commercial manufacture. It is known that grain orientation can be achieved by an induction zoning procedure. See Clark, cited above, page 45; and U.S. Pat. No. 4,308,474, Example 1. As described in the cited patent, partially grain-oriented $Tb_{0.27}Dy_{0.73}Fe_{1.98}$ (terfenol-D) was prepared by horizontal zone procedure. First, the appropriate amounts of the three elements were alloyed by arc-melting into homogeneous buttons of random polycrystalline structure. The buttons were drop cast into rods which were not grain-oriented. The rods were placed in a water-cooled copper tube crucible (cold crucible) extending horizontally in a quartz vacuum chamber. The zone melting operation was carried out under an argon atmosphere with induction heating being used to melt the rods. The melt zone was moved along the horizontal length of the cold crucible.

This forming method had several disadvantages. It required the use of very pure elements, which excluded regular commercial grades of the rare earths terbium, dysprosium and holmium. Lower cost commercial grades of these rare earth metals contain impurities with higher melting points than that of the alloy, such as refractory oxides and carbides. If commercial grade rare earth were employed, the impurities would contaminate the rods and interfere with their desired properties.

Since for optimization the exact ratios of the rare earth metals are critical, it has been necessary in prior procedures to use only small amounts of precisely weighed ingredients and to fuse these into completely homogeneous buttons. There has been a need for a procedure in which complete homogenization of the arc-melted buttons or fingers is not essential, and in which the amounts prepared can be larger.

Another disadvantage of the prior process is that in the zone-melt operation the liquid alloy is in contact with the quartz container for a period of time in which the alloy can be contaminated by the quartz. It would be desirable to avoid the opportunity for quartz contamination of the rods.

SUMMARY OF INVENTION

In accordance with the present invention, semi-homogenized buttons, fingers or the like of the rare earth-iron alloy can be charged to a crucible of relatively large capacity in relation to the individual increments. For example, multiples of semi-homogenized buttons can be combined in the crucible to form a homogeneous melt. The melt in the crucible is held long enough to permit particles of solid contaminants to collect at its upper surface. These operations are carried out under an inert atmosphere which may be subsequently used to create a pressure forcing the melt into upwardly-extending tubes having their lower ends immersed in the melt. Means are provided for inserting and removing the tubes from the melt. The lower ends of the tubes are positioned well below the upper surface of the melt where the solid impurities collect. The molten alloy rises in the mold tubes to the selected level for forming the rods. A portion of the molten alloy is maintained in the crucible, extending to a level above the lower end of the mold tubes. The tubes therefore receive purified alloy from the lower portion of the crucible free from contaminating solid particles. This operation may be repeated as often as required by adding additional alloy increments to the crucible.

After the mold tubes have been filled with the purified alloy, they are withdrawn from the melt within the crucible, and the alloy is permitted to solidify therein. The quartz tubes need be in contact with the molten metal for only a short time, viz. 60 seconds or less. This limits quartz contamination of the alloy. The resulting rods are removed from the reusable quartz tubes. The rods are in polycrystalline form with a randomly oriented grain structure.

As the preferred next step in the process, the rods are subjected to a free-standing progressive zone melting step to produce an axial grain orientation. For this step, the rods are singularly aligned vertically with their sides unsupported. The melt zone is moved upwardly along the rod. Induction heating is used to create the molten zone which is maintained by adjusting the power level of the radio frequency (450 KHz) generator. The work coil for this operation is a multi-turn pancake coil fitted with an inner copper plate concentrator. The width of the melt zone and its rate of upward movement is controlled so that the cross-sectional shape of the rods is reasonably maintained.

THE DRAWINGS

Apparatus for practicing the method of this invention is illustrated by the accompanying drawings, in which:

FIG. 1 is a diagrammatic elevational view of an apparatus for initially forming the rare earth-iron alloy rods;

DETAILED DESCRIPTION

Figure 1A:
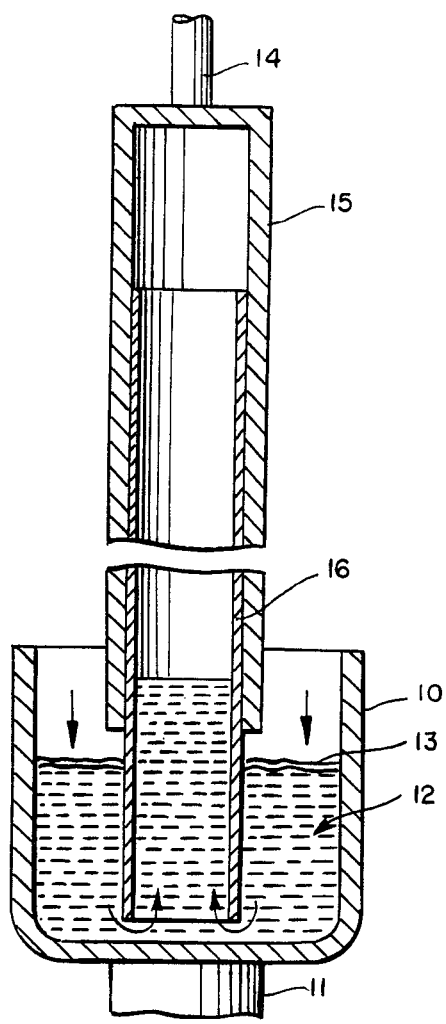
FIG. 1A is an enlarged sectional view of part of the apparatus of FIG. 1, illustrating in more detail the procedure for forming the rods.

Commercial grades of electrolytic iron and purified rare earth metals may be employed. The rare earth metals to be used include terbium (Tb), dysposium (Dy), and holmium (Ho). These metals may contain small amounts of higher melting impurities, such as refractive oxides, carbides, etc. The rare earth metals may contain small amounts of other rare earth metals. Preferably, the metals should have purities of at least 99.9% by weight. The processed alloy should not contain interstitial impurities, H, C, N, O and F, in excess of 600 ppm by weight (~4000 atomic ppm) and metallic impurities, including other rare earth metals, in excess of about 1000 atomic ppm total. The magnetostrictive alloys are preferably combinations of iron with terbium and dysposium or terbium and holmium. Alloys can be prepared with both holmium and dysposium in combination with iron and terbium. The preferred formulations include the following: $Tb_xDy_{1-x}Fe_{1.5-2.0}$, where $0.2<x<1.0$; $Tb_xHo_{1-x}Fe_{2-w}$, where $0.1<x<1.0$; and $Tb_xHo_yDy_zFe_{2-w}$, where $x+y+z=1$. and $0<w<0.5$ in all cases. The most technologically advanced of these is $Tb_xDy_{1-x}Fe_{1.5-2.0}$, where $0.27<x<0.35$, known as Terfenol-D alloys, the optimal formula being $Tb_{0.3}Dy_{0.7}Fe_{1.9}$.

In preparing the metals for alloying, they should be surface cleaned. The appropriate amounts of the metal constituents are weighed and then alloyed by means of a conventional arc-melter. The weighing and proportioning should be precise to achieve the exact alloy formula. In forming the alloys, it is preferred to alloy the rare earth metals first, and then add the iron. The buttons or fingers thus prepared may be only partially homogenized. They do not need to be fully homogenized as obtained by repeated arc-melting.

The buttons or fingers thus formed are charged to a melting crucible. Preferably a plurality of the increments are charged. The crucible can contain an amount of each metal corresponding with the desired proportions. Thus the proportions do not need to be exact with respect to each increment of the charge. Also, the bars or fingers do not need to be fully homogenized as charged to the crucible. Within the crucible, there is formed a molten flowable homogeneous body of the rare earth-iron alloy. The melt is held in the crucible for a sufficient time to permit homogenization to develop, and also to permit the lower density solid particles, comprising the higher melting impurities, to float to the top of the melt and collect on its upper surface.

The crucible is enclosed within a chamber in which an inert gas atmosphere can be maintained under pressure. Argon is a preferred gas. The inert gas is in contact with the upper surface of the molten alloy. Means are provided for decreasing and increasing the gas pressure.

Within the chamber enclosing the crucible there is provided at least one, and preferably a plurality of upwardly-extending hollow mold tubes of refractory material. Quartz tubes of cylindrical shape are preferred. The mold tubes are supported so that their lower end portions can be inserted within the molten alloy. After insertion, the gas pressure in the chamber is increased. This creates a positive pressure differential across the melt referred to as an "argon push." The molten alloy is forced to rise in the mold tubes to selected levels for forming the rods.

During the forming operation, it is important to maintain portions of the molten alloy in the crucible extending to a level above the lower ends of the mold tubes. The solid particles of the higher melting impurities collected at the surface of the molten body thereby remain within the crucible.

The alloy within the mold tubes is permitted to solidify. For this purpose, the tubes may be withdrawn from the melt and held in a cooler zone until the solidification occurs. The rods thus formed are removed from the tubes. The rods are elongated cylindrical bodies. For example, the cylindrical rods may have diameters of from 0.5 to 1.2 cm, and lengths of 15 to 25 cm. The rods thus produced are homogeneous and have a polycrystalline structure of randomly oriented grains.

In the next step, the rods are subjected to a free standing progressive zone melting to produce an axial grain orientation. More specifically, the rods are individually aligned vertically with their sides unsupported. The melt zone is moved upwardly along the rod from its lower to upper portions. The size of the melt zone and its rate of movement are controlled to maintain the shape of the rod. The fully liquid melt zone can be restricted to a height of from about 0.3 to 0.7 cm to prevent distortion. The surface tension of the liquid alloy is sufficient to maintain cross-sectional shape in the melt zone.

The zone melting may be carried out under visual observation when the rod is enclosed in transparent quartz housing. As required, the operator can reduce the heat and/or reduce the speed of movement of the melt zone to avoid shape changes in the melt zone.

ILLUSTRATIVE APPARATUS

The accompanying drawings illustrate apparatus which may be used in practicing the method of this invention. In FIG. 1, there is shown an apparatus for initially forming the alloy rods with random grain orientation. The components of this apparatus have been labeled for convenience of identification. The crucible into which the partially homogenized alloy is charged is enclosed within a tubular quartz chamber, which is surrounded by the turns of a heating coil. These heating coil turns are concentrated at the level of the crucible. An operating rod is provided for raising and lowering the mold tube, which is enclosed within a graphite or tantalum thermal shield. An inner quartz tube is provided around the crucible and the lower portion of the mold tube. The interior of the outer quartz chamber is connected through one valve to a vacuum system, and through another valve to a source of inert gas (e.g., argon). The crucible is supported on a water-cooled pipe which can be adjusted upwardly and downwardly. O-ring seals are provided, as required, at the top and bottom of the chamber to permit movement of the operating rod and/or the crucible-supporting pipe while maintaining the chamber in sealed condition.

The rod forming operation is illustrated more particularly in FIG. 1A. Crucible 10 which contains the alloy melt 12 is supported on the water-cooled pipe 11. The solid particles of contaminants 13 have collected at the upper surface of the melt. The melt is in a homogeneous condition for forming the rods. By means of the operating rod 14, which is connected to the upper end of the graphite shield 15, the quartz mold tube 16 is lowered to a position within the crucible so that its lower end is adjacent to the bottom of the crucible, as shown.

Prior to inserting the mold tube 16 within the melt 12, it is preferred to reduce the argon pressure in the enclosing quartz chamber. After the mold tube has been immersed in the melt, more argon is introduced under pressure into the quartz chamber. This creates a pressure differential across the melt. In effect, the argon pushes on the surface of the melt and forces the melt to rise in the mold tube 16. By adjusting the argon pressure in the chamber, the melt may be caused to rise to selected heights within the mold tube, such as 20-25 cm. The internal diameter of the mold tube may be 0.6 to 1.0 cm.

After the mold tube has been partially filled with the molten metal, it is withdrawn from the remaining melt by means of the operating rod 14. A portion of melt remains within the quartz tube. After solidification of the alloy rod, the mold tube can be removed and the rod separated from the tube.

In the next cycle, the quartz tube can be reinserted within the graphite shield 15, and the operation previously described can be repeated. Between cycles, it will be desirable to recharge the crucible. Additional portions of the alloy are introduced into the crucible and melted therein. The melt is again held to permit homogenization to occur, and for the solid particles to float to the top of the melt. The molding operation is then repeated.

Figure 2A:
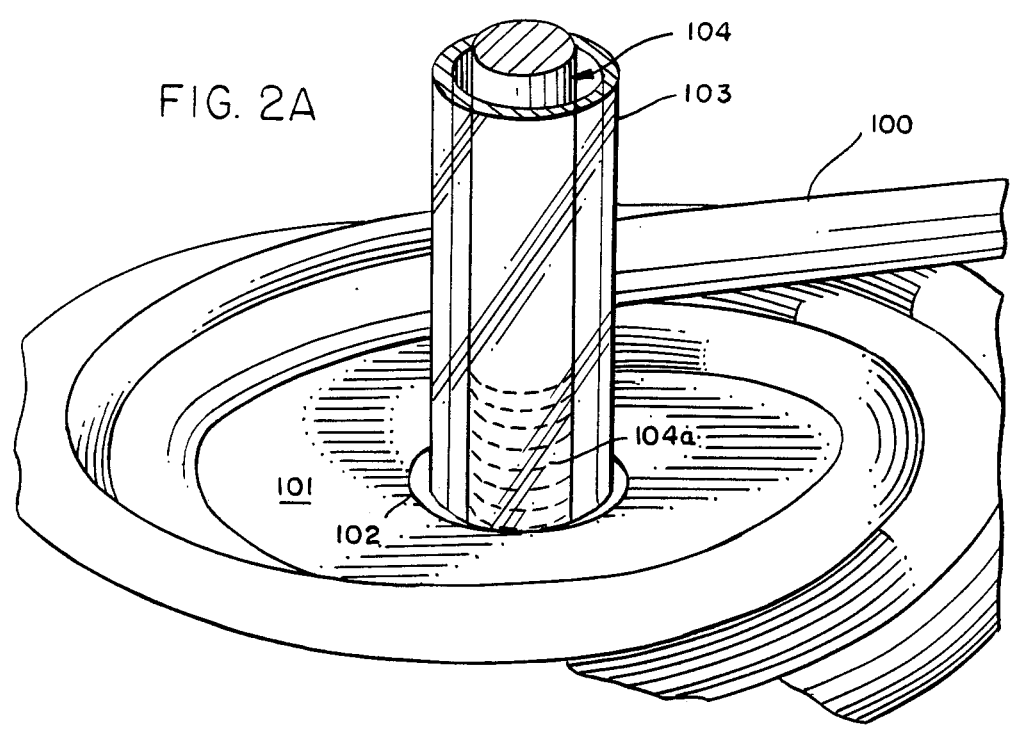
FIG. 2A is an enlarged fragmentary perspective view of part of the apparatus of FIG. 2, illustrating the zone melting procedure in greater detail.
Figure 2:
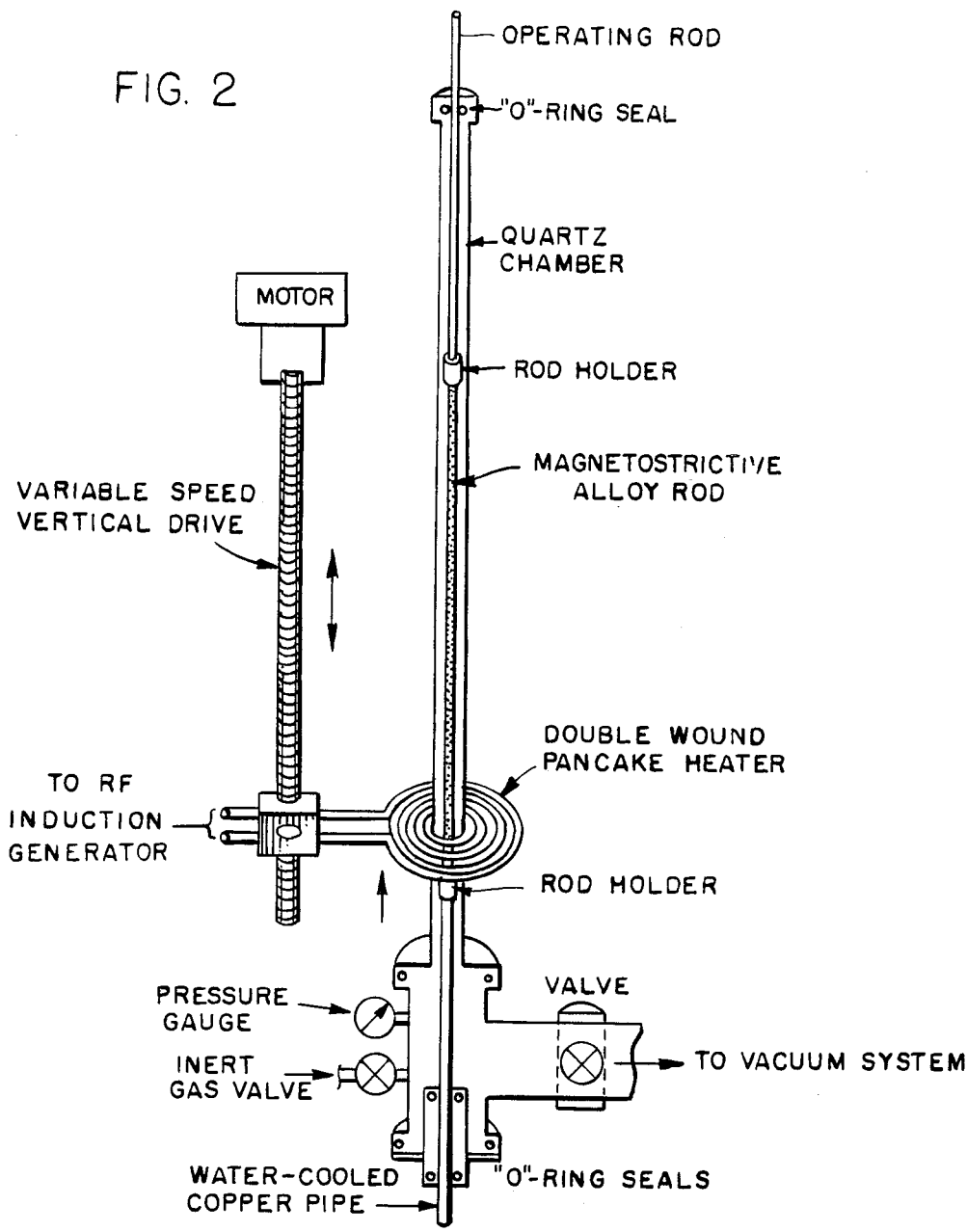
FIG. 2 is a diagrammatic elevational view of an apparatus for carrying out a free standing melting of the alloy rods to produce an axial crystal grain orientation.
Figure 3:
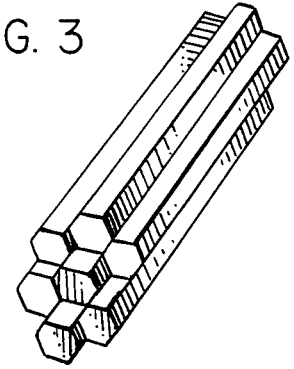
FIG. 3 is a perspective view of completed magnetostrictive rods which have been machined to hexagonal shape from the cylindrical shape in which they were formed.

In FIG. 2 there is shown an apparatus for carrying out a zone melting of the rods. The components of this apparatus have been labeled for convenience of reference.

The apparatus includes an enclosing quartz chamber having a head portion through which extends an operating rod. An O-ring seal is provided within the head portion so that an inert atmosphere can be maintained. The lower end of the operating rod is provided with a rod holder in the form of a recessed cap for receiving the upper end of the alloy rod. The rod extends from the upper rod holder to a similarly constructed lower rod holder attached to the upper end of a water cooled copper pipe, which extends through O-ring seals to the exterior. A vertically movable, double-wound pancake heater is provided around the outside of the quartz chamber. As shown in FIG. 2, the heater is at the level of the lower portion of the rod. A variable speed vertical drive is provided which is operated by means of an electrical motor. The lower end assembly of the apparatus includes a valve-controlled inlet for the inert gas (e.g., helium), and a valve-controlled outlet to a vacuum system.

The zone melting is illustrated in FIG. 2A. The lower turns of the heating coil 100 are fixed to a copper concentrator plate 101, having a central opening 102 through which the enclosing quartz tube 103 extends. The rod 104 is centered within the tube 103 with its sidewalls spaced from the interior of the tube. The sides of the rod are unsupported during the zone melting operation. A melt zone 104a is indicated in FIG. 2.

ILLUSTRATIVE OPERATING CONDITIONS

Rods of terfenol-D are prepared as follows:

The as-received Fe is surface cleaned by immersion in ethyl alcohol and arc-melted into bar shapes. The slight dross on the surface of these bars is chemically removed by immersion in a solution of 80 parts $H_2O_2$, 15 parts $H_2O$ and 5 parts HF at 0° C. for 30 seconds. Bar shapes of commercial grades of Tb and Dy are surface cleaned electrolytically in a solution of 6% perchloric in methanol which is maintained at $-70°$ C.

Appropriate amounts of the constituents are weighed and alloyed by the use of a conventional non-consumable arc-melter. The exact stoichiometry is dictated by the particular application, for example, $Tb_{0.27}Dy_{0.73}Fe_{1.9-2.0}$, for the Terfenol-D composition. The Tb and Dy are alloyed first and the iron is added to this homogeneous rare earth alloy. The alloy can be homogenized by repeated arc-melting and then arc-cast into bar shapes. However, partial homogenization of the iron with the rare earth metals is acceptable. It is more important in the alloy preparation step to homogenize the Tb and Dy in the required ratio. This will eliminate the microsegregation in the final product.

Uniform diameter rods of reasonable lengths are needed to carry out the free standing float zone melt. Various heaters may be used. For example, portions of the alloy may be melted in a pyrolytic BN crucible by direct induction heating or indirectly through the use of a Ta susceptor. Alternatively, quartz or $Al_2O_3$ crucibles can be used. Before melting the evacuated sample chamber is isolated and backfilled to $-15$ psi Argon pressure. The quartz tube (closed end up) is attached to the height-adjustable steel rod. The amount of alloy in the crucible depends on the size and number of quartz tubes to be filled. The work coil design is a function of the melt crucible and thermal shield material. The temperature of the thermal shield can be between 1000° and 1100° C. to accept the molten alloy. This can be accomplished by adjusting the spacing of the 10 to 12 turn work coil. After the alloy is melted, the open end of the quartz tube, which extends about 5 cm beyond the bottom of the thermal shield, is immersed in the liquid metal. The Argon pressure is gradually increased to 30 psi, and the molten alloy is thereby pushed into the quartz tube. The molded rod is cooled in the quartz tube by reducing the induction generator power; the molten metal can be in contact with the quartz sample tube for less than one minute. The dimensions of the quartz tubes depend on the final dimensions of the elements being fabricated. Desirable rod sizes are from 0.6 to 1.0 cm diameters and from 15 to 25 cm lengths.

The rods prepared as described are surface cleaned and zone melted in order to obtain directional solidification along the length of the rod axis. This axial grain orientation is necessary in order to reduce the effects of anisotropy in the magnetostriction. An ideal alignment would be the [111] crystallographic direction along the rod axis. Such alignment would require a minimum magnetization energy and would produce the maximum magneto-mechanical coupling. This ideal can be approximated by the method of this invention. The rods that result from the method approach the ultimate form in that the [111] crystallographic direction is consistently between 10 to 15 degrees from the drive axis.

The grain orientation is accomplished by zone melting the preformed rods in a free-standing mode. Induction heating is used to create the molten zone which can be controlled to less than 0.8 cm (limited by surface tension) and greater than 0.3 cm (to assure complete melting). Preferably the power generator should possess a stability of less than 5% ripple, and have fast response to power adjustments. Zone rates of between 25 and 50 cm/hr for the directional orientation can be used.

The directionally oriented rods may be heat treated in a vacuum tube furnace chamber to achieve phase equilibria. This can be accomplished at 950° C. for a period of five days. A slow cool down period, usually overnight, is desirable in order to avoid cracking. Because of the brittle nature of this intermetallic compound, uniform diameters are preferably obtained by a centerless grinding operation. For stacking purposes, the cylindrical rods can be bench ground to square, hexagonal or other geometric cross-sections.

The advantages of the method can be summarized as follows. (1) Process contamination is reduced since the molten alloy is in contact with the quartz container for a shorter period of time (less than one minute). (2) The impurities that are not soluble at the alloy melt temperature are concentrated in the top portion of the crucible melt and remain behind. (3) A major cost reduction is realized since cheaper, commerical grade rare earth metals can be used as starting materials. (4) Two-fold labor savings in the alloy preparation, since it is not necessary to either completely homogenize the alloy or arc-cast it into small diameter fingers. This means that alloy charges of larger volumes can be prepared by the cheapest method, e.g., direct combination of the constituents in a crucible. (5) The macrosegregation is eliminated which results in improved performance of the drive elements. (6) Cost reduction due to the increased capacity—greater number of uniform rods can be formed in the same time period that produced only one by the previous method.

I claim:

1. In the manufacturing of rods of magnetostrictive alloys of iron with rare earth metals, said alloys including terbium (Tb) together with dysprosium (Dy) and/or holmium (Ho), the method steps comprising:
    (a) forming a molten flowable body of said rare earth-iron alloy in a crucible enclosed within a chamber, the upper surface of said molten body being in contact with an inert gas within said chamber;
    (b) providing an upwardly-extending hollow mold tube of refractory material positioned with its lower end portion within said molten body, the interior of said mold tube being separated from the gas in said chamber by said molten body;
    (c) creating a pressure differential between said chamber gas and the interior of said mold tube forcing a portion of the molten alloy to rise in said mold tube to a selected level for forming a rod; and
    (d) maintaining a portion of said molten alloy in said crucible extending to a level above the lower end of said mold tube, solid particles of higher melting impurities present in said alloy collecting at the surface of said molten body and remaining within said crucible as said rod is formed in said mold tube.

2. The rod manufacturing steps of claim 1 in which said alloy is represented by the formula $Tb_xDy_{1-x}Fe_{1.5-2.0}$ wherein x is a number from 0.27 to 0.35.

3. The rod manufacturing steps of claim 1 or claim 2 in which the inert gas within said chamber is argon and the interior of said mold tube is evacuated.

4. The rod manufacturing steps of claim 1 in which said mold tube is formed of quartz and has a circular cross section.

5. The method of manufacturing rods of grain-oriented magnetostrictive alloys, said alloys including terbium (Tb) together with dysprosium (Dy) and/or holmium (Ho), the method steps comprising:
    (a) forming a molten flowable body of said rare earth-iron alloy in a crucible enclosed within a chamber, the upper surface of said molten body being in contact with an inert gas within said chamber;
    (b) providing an upwardly-extending hollow mold tube of refractory material positioned with its lower end portion within said molten body, the interior of said mold tube being separated from the gas in said chamber by said molten body;
    (c) creating a pressure differential between said chamber gas and the interior of said mold tube forcing a portion of the molten alloy to rise in said mold tube to a selected level for forming a rod;
    (d) maintaining a portion of said molten alloy in said crucible extending to a level above the lower end of said mold tube, solid particles of higher melting impurities present in said alloy collecting at the surface of said molten body and remaining within said crucible as said rod is formed in said mold tube;
    (e) solidifying the rod within said mold tube and then removing it therefrom; and
    (f) subjecting the formed rod to free standing progressive zone melting to produce an axial grain orientation, the rod being aligned vertically with its sides unsupported and the melt zone moving upwardly along said rod.

6. The method of claim 5 in which said alloy is represented by the formula $Tb_xDy_{1-x}Fe_{1.5-2.0}$ wherein x is a number from 0.27 to 0.35.

7. The method of claim 5 in which said zone melting is carried out while maintaining the cross-sectioned shape of said rod.

8. The method of claim 7 in which said alloy is represented by the formula $Tb_xDy_{1-x}Fe_{1.5-2.0}$ wherein x is a number from 0.27 to 0.35.

9. The method of claim 8 in which said rod is of circular cross-sectional with a diameter of from about 0.5 to 1.2 cm.

10. The method of claim 9 in which said melt zone is maintained with a vertical extent of from about 0.3 to 0.7 cm.

* * * * *